(12) United States Patent
Kwak

(10) Patent No.: US 8,253,223 B2
(45) Date of Patent: Aug. 28, 2012

(54) DIODE FOR ADJUSTING PIN RESISTANCE OF A SEMICONDUCTOR DEVICE

(75) Inventor: Kook Whee Kwak, Ichon (KR)

(73) Assignee: SK hynix Inc. (KR)

( * ) Notice: Subject to any disclaimer, the term of this patent is extended or adjusted under 35 U.S.C. 154(b) by 0 days.

(21) Appl. No.: 13/359,744

(22) Filed: Jan. 27, 2012

(65) Prior Publication Data

US 2012/0119320 A1    May 17, 2012

Related U.S. Application Data

(62) Division of application No. 12/175,244, filed on Jul. 17, 2008.

(30) Foreign Application Priority Data

Jul. 20, 2007   (KR) .................. 10-2007-0072748

(51) Int. Cl.
*H01L 29/06*    (2006.01)

(52) U.S. Cl. .................. 257/653; 257/594; 257/E27.051

(58) Field of Classification Search .................. 257/355, 257/501, 594, 653, E27.046, E27.051, E29.327, 257/E29.336
See application file for complete search history.

(56) References Cited

FOREIGN PATENT DOCUMENTS

| KR | 1020050108586 | 11/2005 |
| KR | 1020050108586 A | 11/2005 |

*Primary Examiner* — Tucker Wright
(74) *Attorney, Agent, or Firm* — Baker & McKenzie LLP

(57) ABSTRACT

A diode comprises a P-type well formed in a semiconductor substrate, at least one N-type impurity doping area formed in the P-type well, an isolation area formed to surround the N-type impurity doping area, a P-type impurity doping area formed to surround the isolation area, first contacts formed in the N-type impurity doping area in a single row or a plurality of rows, and second contacts formed in the P-type impurity doping area in a single row or a plurality of rows, wherein pin resistance can be adjusted through changing any one of a distance between the N-type impurity doping area and the P-type impurity doping area, a contact pitch between the first contacts, and a contact pitch between the second contacts.

10 Claims, 6 Drawing Sheets

DIODE FOR ADJUSTING PIN RESISTANCE OF A SEMICONDUCTOR DEVICE

CROSS-REFERENCES TO RELATED APPLICATION

The present application claims priority to and is a divisional application of U.S. patent application Ser. No. 12/175,244 entitled "A diode for adjusting pin resistance of a semiconductor device" filed Jul. 17, 2008 that claims priority under 35 U.S.C. 119(a) to Korean application number 10-2007-0072748, filed on Jul. 20, 2007, in the Korean Intellectual Property Office, all of which are incorporated by reference in their entirety as if set forth in full.

BACKGROUND

1. Technical Field

The embodiments described herein relate to a semiconductor device, and more particularly, to a diode that can be used for adjusting a pin resistance of a semiconductor product.

2. Related Art

In a semiconductor device, an input/output circuit will often comprise a plurality of components such as an electrostatic protection circuit, an input buffer and an output buffer. Each of these components will include their respective resistance components and capacitance components. The pin resistance is then is obtained by adding the resistance component of the input/output circuit and the resistance component of the associated package. The pin capacitance is obtained by adding the capacitance component of the input/output circuit and the capacitance component of the package.

With respect to the pin resistance, the resistance of a package is as small and can often be neglected.

In order to maintain signal integrity during operation of a semiconductor circuit, a predetermined level of pin resistance is required. As a result, the minimum value and the maximum value of pin resistance are often regulated in a specification associated with the semiconductor circuit.

FIG. 1 illustrates a typical example of an input circuit used in a conventional semiconductor integrated circuit. Referring to FIG. 1, it can be seen that the input circuit includes an input pad 100, a first electrostatic discharge section 110 and a second electrostatic discharge section 120 for protecting an internal circuit 170 from static electricity generated from the input pad 100, a power clamp circuit 130 for providing an electrostatic discharge path between a power voltage supply line Vcc and a ground voltage supply line Vss when static electricity is generated, an input buffer 160 for transmitting a signal, input through the input pad 100 to the internal circuit 170, and a resistor 140 and a MOS transistor 150 for protecting the input buffer 160.

During normal operation, the electrostatic discharge sections 110 and 120 and the power clamp circuit 130 are turned off to exert no influence on normal circuit operation. In the event that static electricity is generated between the input pad 100 and power pads, then discharge sections 110 and 120 will enter an operation mode and provide the electrostatic discharge path so that the input buffer 160 and the internal circuit 170 can be protected from transient electrostatic current.

Currently, a MOS transistor and a diode are widely used as the first electrostatic discharge section 110 and the second electrostatic discharge section 120. Since a diode is significantly better in terms of electrostatic protection as function of parasitic capacitance than a MOS transistor, the diode is more appropriate for a circuit operating at a high speed, and therefore, the number of products using a diode is increasing.

However, because a diode has smaller resistance and capacitance than those of a MOS transistor, the pin resistance is markedly decreases and therefore may not satisfy the specified pin resistance.

FIGS. 2a and 2b illustrate the structure of the first electrostatic discharge section 110 in a conventional semiconductor circuit. FIG. 2a is a plan view and FIG. 2b is a sectional view taken along the line A-B of FIG. 1.

The first electrostatic discharge section 110 includes a P-type well 111 formed in the surface of a P-type semiconductor substrate, one or a plurality of N+ impurity areas 112 formed in the surface of the substrate within the P-type well 111, one or a plurality of insulation areas 113 formed in the surface of the substrate to surround the respective N+ impurity areas 112, and a P+ impurity area 114 formed in the surface of the substrate to surround the insulation areas 113.

The N+ impurity areas 112 and the P-type well 111 constitute a PN diode. In the case that this diode is used as the first electrostatic discharge section 110 of FIG. 1, the N+ impurity areas 112 are connected to the input pad 100 through contacts 115, and the P+ impurity area 114 is connected to the ground voltage supply line (Vss) through contacts 115.

Referring to FIG. 2b, it can be observed that the P-type well 111 is formed in the substrate, the plurality of N+ impurity areas 112 and the P+ impurity area 114 are formed in the P-type well 111, and the insulation areas 113 are formed between the N+ impurity areas 112 and the P+ impurity area 114. Further, in order to connect the input pad 100 and the ground voltage supply line (Vss), the contacts 115 are formed on the N+ impurity areas 112 and the P+ impurity area 114.

In a conventional diode structure as described above, the contacts 115 are arranged in the N+ impurity areas (cathodes) 112 and the P+ impurity area (anode) 114 to have minimum pitches D1 and D2 permitted by an associated design rule in order to minimize the operation resistance of the diode. Also, the distance D3 between the N+ impurity area 112 and the P+ impurity area 114 is set as a minimum distance permitted by the design rule.

Accordingly, when a conventional diode is laid out according to the minimum design rule, the pin resistance of a semiconductor product, which uses the diode as an electrostatic protection element, is likely to be less than regulated minimum pin resistance, since the diode parasitic resistance is small and therefore the degree to which the diode contributes to pin resistance is also small.

In particular, in order to reduce parasitic capacitance to allow high speed operation of a semiconductor product, the decrease in pin resistance will raise a serious problem, because the electrostatic discharge section cannot but be minimized.

SUMMARY

Apparatus and methods for increasing the resistance of a diode used in an input/output pad are described herein.

In one aspect, a diode comprises a P-type well formed in a semiconductor substrate, at least one N-type impurity doping area formed in the P-type well, an isolation area formed to surround the N-type impurity doping area, a P-type impurity doping area formed to surround the isolation area, first contacts formed in the N-type impurity doping area in a single row or a plurality of rows, and second contacts formed in the P-type impurity doping area in a single row or a plurality of rows, wherein pin resistance can be adjusted through changing any one of a distance between the N-type impurity doping area and the P-type impurity doping area, a contact pitch between the first contacts, and a contact pitch between the second contacts.

The distance between the N-type impurity doping area and the P-type impurity doping area can be determined to be at least two times greater than a distance that is defined according to a design rule for a minimum distance between an N-type impurity doping area and a P-type impurity doping area in a corresponding product.

The contact pitch between the first contacts can be determined to be at least two times greater than a contact pitch that is defined according to a minimum contact pitch design rule in the corresponding product.

The contact pitch between the second contacts can be determined to be at least two times greater than a contact pitch that is defined according to a minimum contact pitch design rule in the corresponding product.

One N-type impurity doping area is formed to be elongate or at least two N-type impurity doping areas are formed to be parallel to one another.

In another aspect, a diode comprises an N-type well formed in a semiconductor substrate, at least one P-type impurity doping area formed in the N-type well, an isolation area formed to surround the P-type impurity doping area, an N-type impurity doping area formed to surround the isolation area, first contacts formed in the P-type impurity doping area in a single row or a plurality of rows, and second contacts formed in the N-type impurity doping area in a single row or a plurality of rows, wherein pin resistance can be adjusted through changing any one of a distance between the P-type impurity doping area and the N-type impurity doping area, a contact pitch between the first contacts, and a contact pitch between the second contacts.

The distance between the P-type impurity doping area and the N-type impurity doping area can be determined to be at least two times greater than a distance that is defined according to a design rule for a minimum distance between a P-type impurity doping area and an N-type impurity doping area in a corresponding product.

The contact pitch between the first contacts can be determined to be at least two times greater than a contact pitch that is defined according to a minimum contact pitch design rule in the corresponding product.

The contact pitch between the second contacts can be determined to be at least two times greater than a contact pitch that is defined according to a minimum contact pitch design rule in the corresponding product.

One P-type impurity doping area can be formed to be elongate or at least two P-type impurity doping areas are formed to be parallel to one another.

In still another aspect, a diode comprises a P-type well formed in a semiconductor substrate, at least one N-type impurity doping area formed in the P-type well, at least one P-type impurity doping area formed in the P-type well to be parallel to the N-type impurity doping area, at least one isolation area formed between the N-type impurity doping area and the P-type impurity doping area, first contacts formed in the N-type impurity doping area in a single row or a plurality of rows, and second contacts formed in the P-type impurity doping area in a single row or a plurality of rows, wherein pin resistance can be adjusted through changing any one of a distance between the N-type impurity doping area and the P-type impurity doping area, a contact pitch between the first contacts, and a contact pitch between the second contacts.

The distance between the N-type impurity doping area and the P-type impurity doping area can be determined to be at least two times greater than a distance that is defined according to a design rule for a minimum distance between an N-type impurity doping area and a P-type impurity doping area in a corresponding product.

The contact pitch between the first contacts can be determined to be at least two times greater than a contact pitch that is defined according to a minimum contact pitch design rule in the corresponding product.

The contact pitch between the second contacts can be determined to be at least two times greater than a contact pitch that is defined according to a minimum contact pitch design rule in the corresponding product.

Some of the first contacts or some of the second contacts can have the contact pitch at least two times greater than a contact pitch that is defined according to a minimum contact pitch design rule in the corresponding product.

In still another aspect, a diode comprises an N-type well formed in a semiconductor substrate, at least one P-type impurity doping area formed in the N-type well, at least one N-type impurity doping area formed in the N-type well to be parallel to the P-type impurity doping area, at least one isolation area formed between the P-type impurity doping area and the N-type impurity doping area, first contacts formed in the P-type impurity doping area in a single row or a plurality of rows, and second contacts formed in the N-type impurity doping area in a single row or a plurality of rows, wherein pin resistance can be adjusted through changing any one of a distance between the P-type impurity doping area and the N-type impurity doping area, a contact pitch between the first contacts, and a contact pitch between the second contacts.

The distance between the P-type impurity doping area and the N-type impurity doping area can be determined to be at least two times greater than a distance that is defined according to a design rule for a minimum distance between a P-type impurity doing area and an N-type impurity doping area in a corresponding product.

The contact pitch between the first contacts can be determined to be at least two times greater than a contact pitch that is defined according to a minimum contact pitch design rule in the corresponding product.

The contact pitch between the second contacts can be determined to be at least two times greater than a contact pitch that is defined according to a minimum contact pitch design rule in the corresponding product.

Some of the first contacts or some of the second contacts have the contact pitch at least two times greater than a contact pitch that can be defined according to a minimum contact pitch design rule in the corresponding product.

In a still further aspect, a diode can be provided wherein pin resistance can be adjusted through changing at least one of a distance between an anode and a cathode, a contact pitch of the anode, and a contact pitch of the cathode.

The distance between the anode and the cathode can be determined to be at least two times greater than a distance that is defined according to a minimum design rule in a corresponding product.

The contact pitch of the anode can be determined to be at least two times greater than a contact pitch that is defined according to a minimum contact pitch design rule in the corresponding product.

The contact pitch of the cathode can be determined to be at least two times greater than a contact pitch that is defined according to a minimum contact pitch design rule in the corresponding product.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 2b is a sectional view taken along the line A-B of FIG. 2a.

DETAILED DESCRIPTION

Figure 3:
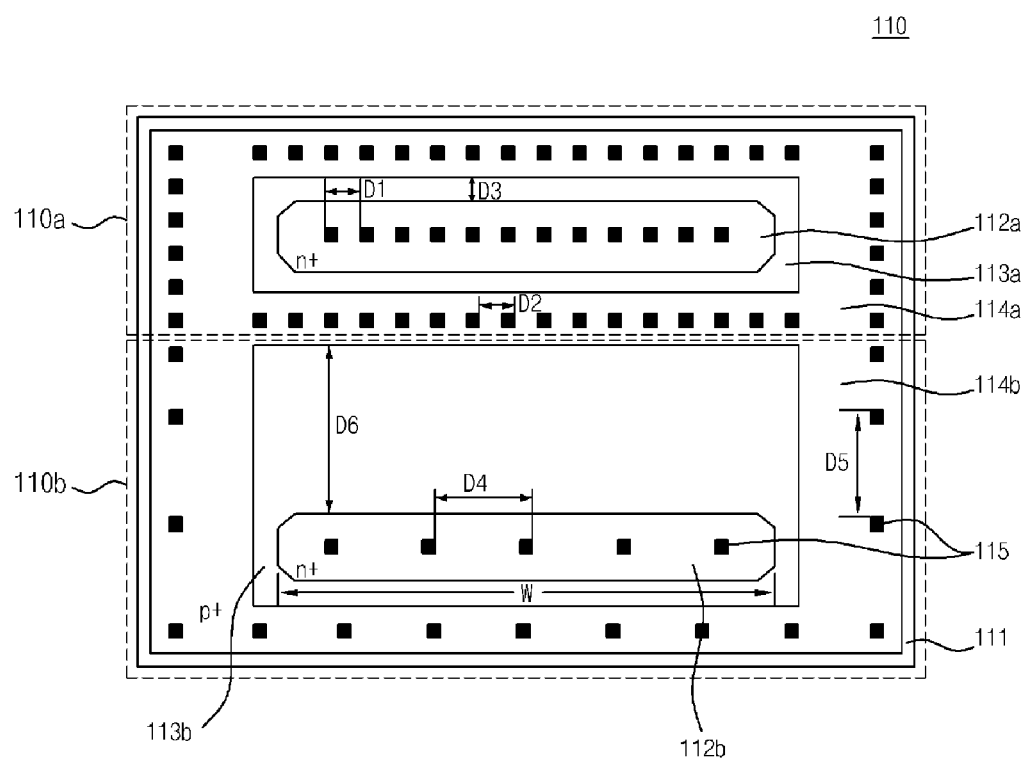
FIG. 3 is a layout diagram of a diode constructed in accordance with one embodiment.

FIG. 3 is a layout diagram of a diode 110 constructed in accordance with one embodiment. The reference number 110 is used in FIG. 3 to indicate that the diode depicted therein can be used in a similar fashion to the diode illustrated in FIG. 1 and described above.

The diode 110 can be divided into a first region 110a, which can be laid out according to a minimum design rule and a second region 110b, which can be laid out to have the pitches between contacts greater than those regulated by the minimum design rule.

Still referring to FIG. 3, the diode 110 can include a P-type well 111, which can be formed in a P-type semiconductor substrate, a first N+ impurity area (an N-type impurity doping area) 112a and a second N+ impurity area 112b, a first isolation area 113a and a second isolation area 113b, which can be formed to surround the first N+ impurity area 112a and the second N+ impurity area 112b, a first P+ impurity area (a P+ impurity doping area) 114a and a second P+ impurity area 114b, which can be formed to surround the first isolation area 113a and the second isolation area 113b, and contacts 115, which can be formed in each of the first and second N+ impurity areas 112a and 112b and the first and second P+ impurity areas 114a and 114b in a single row or a plurality of rows.

While the first region 110a and the second region 110b are illustrated separately and are designated by different reference numerals, it is to be readily understood that they operate together as the diode 110, are formed through the same processes, and are referenced separately only for the sake of convenience in explanation.

In the P-type well 111, only one N+ impurity area can be formed to be elongate, or two or more N+ impurity areas can be formed as described below. In the present embodiment, two N+ impurity areas are exemplarily formed in the P-type well 111.

The pitch D1 of the contacts 115 formed in the first N+ impurity area 112a of the first region 110a, the pitch D2 of the contacts 115 formed in the first P+ impurity area 114a of the first region 110a, and the distance D3 between the first N+ impurity area 112a and the first P+ impurity area 114a can all be determined according to the minimum design rule of a corresponding product in which the diode 110 is used.

The pitch D4 of the contacts 115 formed in the second N+ impurity area 112b of the second region 110b, the pitch D5 of the contacts 115 formed in the second P+ impurity area 114b of the second region 110b, and the distance D6 between the second N+ impurity area 112b and the second P+ impurity area 114b can be determined to be greater than those according to the minimum design rule so that pin resistance is increased. For example, D4, D5 and D6 can each be determined to be at least two times greater than D1, D2 and D3.

In this way, D4, D5 and D6 can be determined to be at least two times greater than D1, D2 and D3 regulated according to the minimum design rule, and as the case may be, only one or two of D4, D5 and D6 can be applied.

By adjusting the pitches of the contacts and the distance between the impurity areas, it is possible to form a diode having pin resistance that falls within the range regulated in a specification, i.e., the pin resistance required by a specific implementation.

The following is an explanation of how the pin resistance of the diode can be increased using the above-described structure.

First, it will be understood that the resistance of a diode is composed of contact resistance and well resistance between an anode and a cathode. Since the contact resistance has a value that is obtained through dividing the resistance of one contact by the total number of contacts, the contact resistance increases in proportion to a contact pitch. In other words, if the contact pitch is increased, contact resistance increases, because the number of contacts decreases.

The well resistance between an anode and a cathode has a value that is obtained through multiplying the sheet resistance of a well by the distance L between the anode and the cathode and then dividing the resultant product by the width W of a diode finger. Therefore, if the distance L between the anode and the cathode increases, the well resistance increases in proportion to the distance L. Accordingly, the resistance of a diode can be designed using the above-described three parameters so that a desired value can be obtained.

Figure 1:
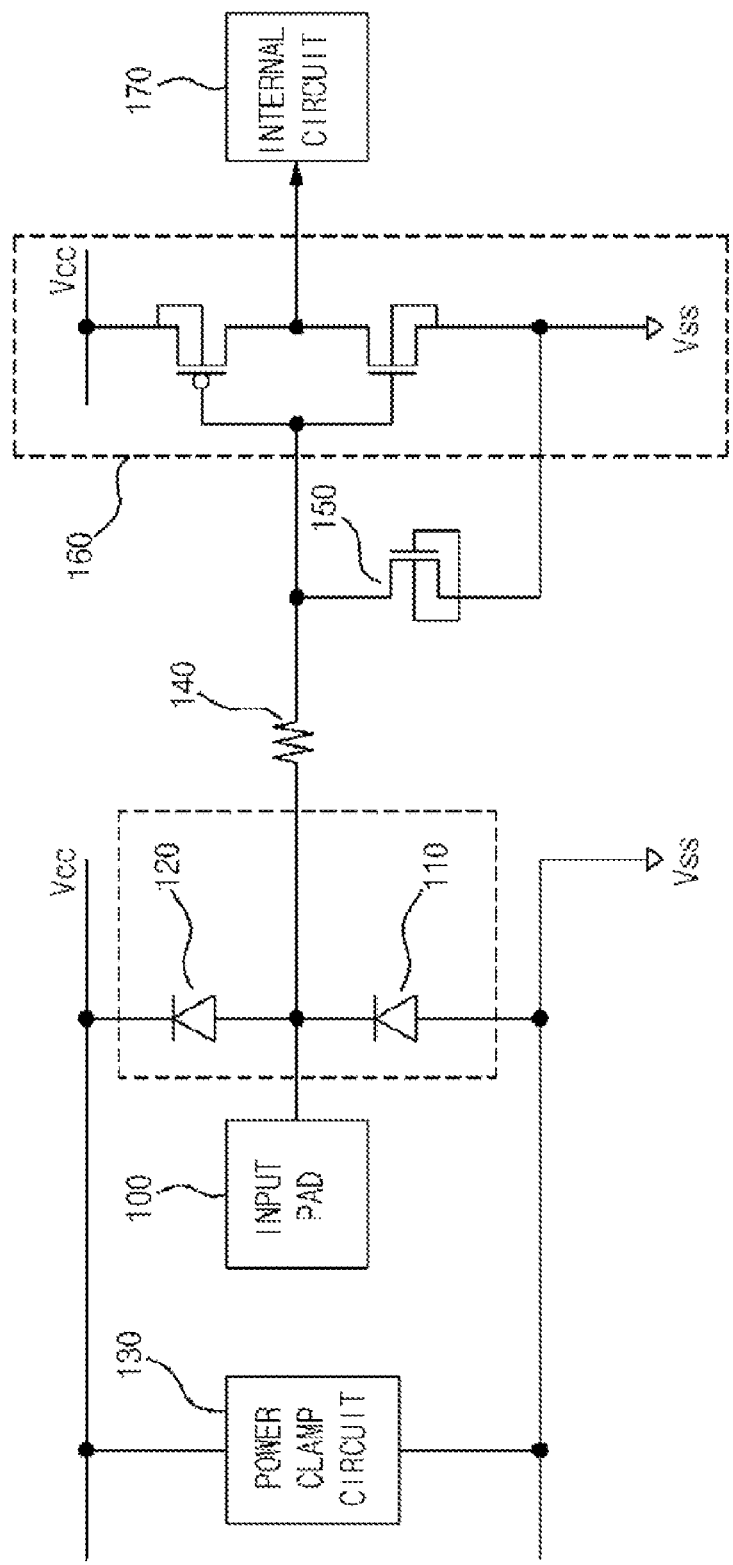
FIG. 1 is a diagram illustrating a conventional input/output pad used in an input/output circuit of a semiconductor device.

When the diode 110 is connected to the input/output pad of the semiconductor circuit as shown in FIG. 1, the first region 110a having the same structure as a conventional diode can perform a function of discharging static electricity and protecting a circuit, and the second region 110b can perform a function of increasing pin resistance.

Figure 4:
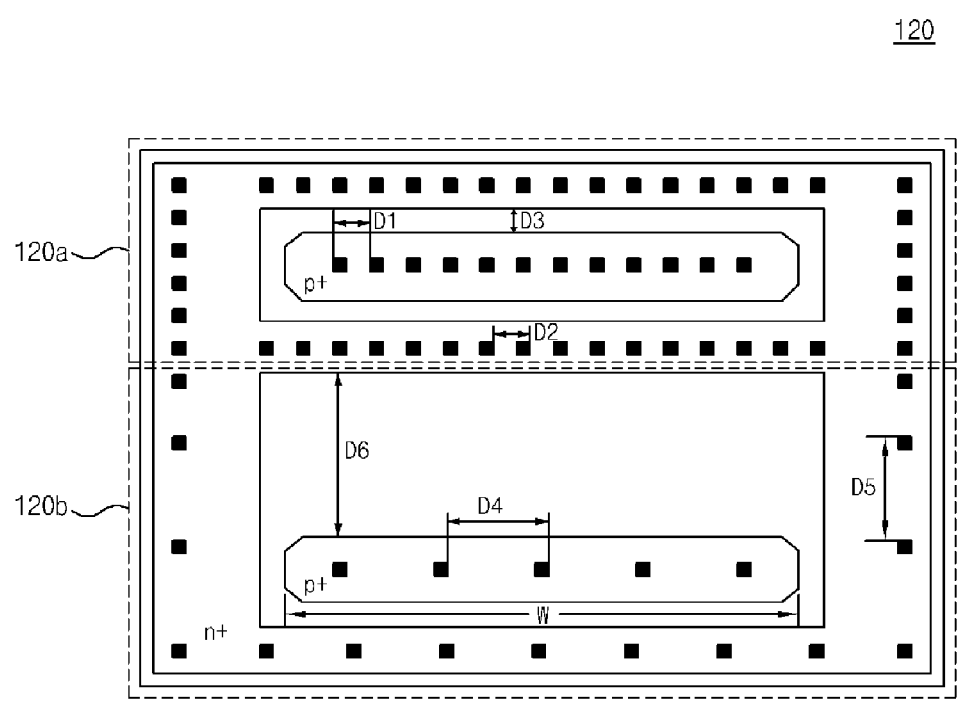
FIG. 4 is a layout diagram of a diode constructed in accordance with another embodiment.

FIG. 4 illustrates the layout of the second electrostatic discharge section 120 constructed in accordance with another embodiment. Again, reference number 120 is used to indicate that a diode constructed as illustrated in FIG. 4 can perform the functions described in relation to diode 120 in FIG. 1.

Generally, the diode such as the first electrostatic discharge section 110 described with reference to FIG. 3 is called an N-type diode and the diode shown in FIG. 4 is called a P-type diode. Further, since the diode 120 has the same structure as the diode 110 described with reference to FIG. 3 except that it has opposite polarity, the detailed description thereof will be omitted herein.

Referring to FIG. 4, it can be observed that the pitches D4 and D5 of contacts and the distance D6 between impurity areas in a second region 120b can be set to be greater than the pitches D1 and D2 of contacts and the distance D3 between impurity areas in a first region 120a.

When the diode 120 is connected to the input/output pad of a semiconductor circuit, the first region 120a can perform a function of discharging static electricity and protecting a circuit, and the second region 120b performs a function of increasing pin resistance.

Figure 5:
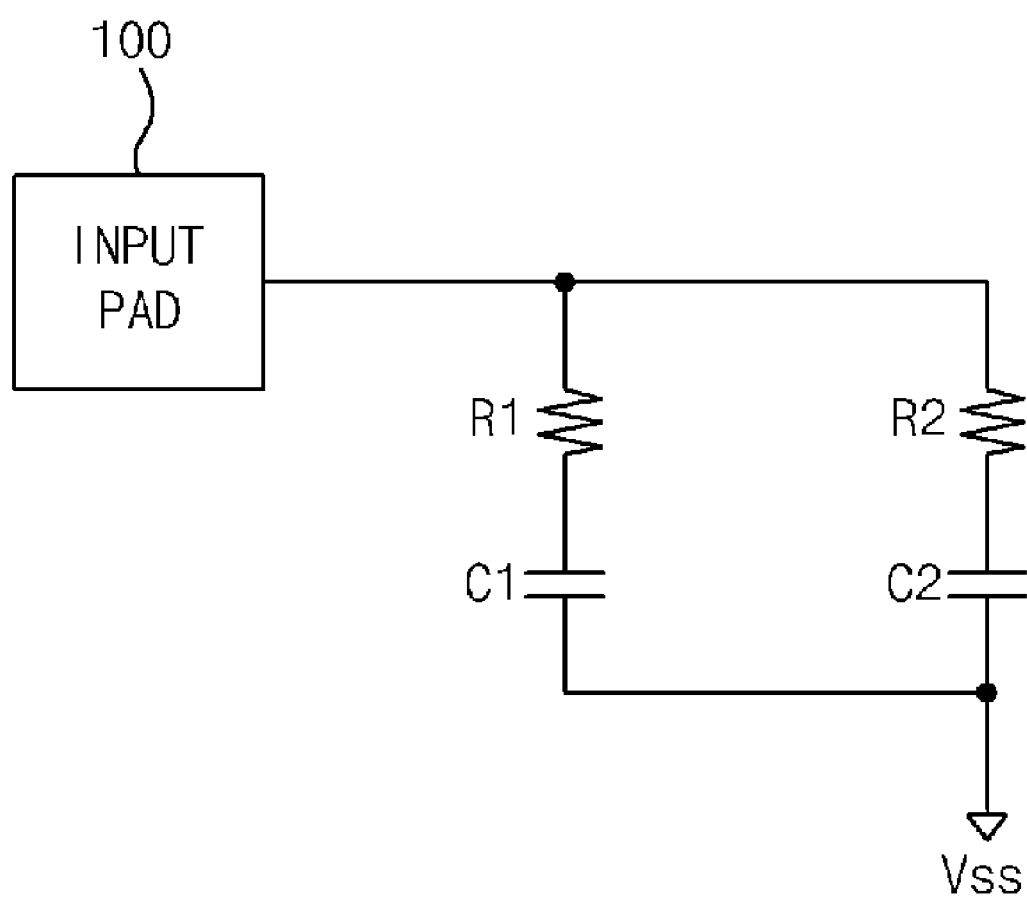
FIG. 5 is circuit diagram of a diode for adjusting pin resistance according to one embodiment.

The influence due to the increase of resistance in the diode as described above can be modeled using a simple equivalent circuit shown in FIG. 5. In this model, R1 and C1 respectively represent the pin resistance and the pin capacitance of a conventional semiconductor device, and R2 and C2 respectively represent the parasitic resistance and the parasitic capacitance of a diode configured in accordance with the embodiments described herein and which can be connected to a pad in order to increase the pin resistance of the conventional semiconductor device.

For example, suppose a semiconductor product has the following parameters: R1=3.5Ω and C1=1 pF. If the minimum pin resistance of a semiconductor product regulated in the associated specification is 4Ω, then it is necessary to increase pin resistance by about 1Ω to meet the requirements of that specific implementation. Calculating pin resistance using the equivalent circuit of FIG. 5, in the case of using the diode for the purpose of increasing resistance, pin resistance Rpin is obtained by multiplying the respective resistance by the square of the respective capacitance, adding the resultant products, and then dividing the resultant sum by the square of total capacitance.

When expressing the pin resistance in a numerical formula, the following Mathematical Expression 1 is obtained.

$$R_{PIN} = \frac{R1 \cdot C1^2 + R2 \cdot C2^2}{(C1 + C2)^2} \quad \text{[Mathematical Expression 1]}$$

Generally, a diode having the width of 20 μm and the anode area width of 1 μm is used for electrostatic protection. The junction capacitance of this diode has the level of 0.03 pF. In the case of the semiconductor product manufactured using a process below 0.1 μm, the sheet resistance of a P-type well is 1,500Ω/square, the contact resistance of a metal-P+ area is 1,500Ω/contact, the contact resistance of a metal-N+ area is 500Ω/contact, and the contact pitch and the distance between the anode and the cathode according to the minimum design rule are about 0.4 μm.

Therefore, when using the minimum design rule, since 50 contacts are located in the anode and 50 contacts are located in the cathode, contact resistance is calculated as 1,500/50+ 500/50=40Ω and well resistance is calculated as 1,500*0.5/ 20=37.5Ω, whereby total diode resistance becomes about 80Ω. When the number of such diode, which is laid out according to the minimum design rule, is increased by one pin resistance rather decreases from 3.5Ω to (80*0.03*0.03+ 3.5*1*1)/(1.03*1.03)=3.4Ω.

If the contact pitch of the anode is considerably increased by using only one contact at the center portion of the anode, as described herein, the total diode resistance is calculated as 1,500/1+500/50+37.5=1,547.5Ω and becomes about 1,550Ω. By increasing the number of such a diode by one, pin resistance significantly increases to (1550*0.03*0.03+ 3.5*1*1)/(1.03*1.03)=4.6Ω and can satisfy the specification. That is to say, since pin resistance can be increased by 1Ω or more, the embodiments described herein can be advantageously adapted for adjusting pin resistance.

Figure 6:
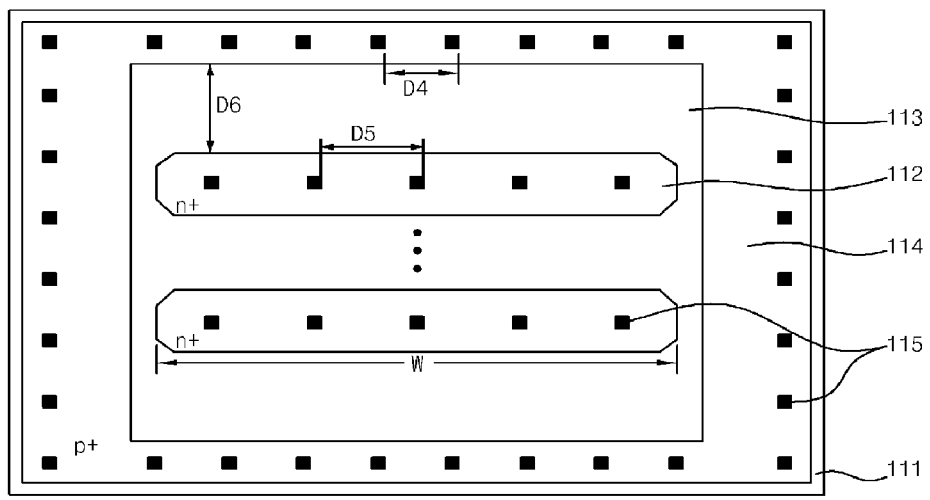
FIG. 6 is a layout diagram of a diode constructed in accordance with still another embodiment.

FIG. 6 is a layout diagram of a diode constructed in accordance with another embodiment.

In the aforementioned embodiments, one region is laid out according to the minimum design rule as in a conventional device, and the other region is laid out according to the principles described above. In the example embodiment of FIG. 6, an entire region is laid out according to the principles described above.

Thus, a diode constructed according to the embodiment of FIG. 6 can include a P-type well 111 formed in a P-type semiconductor substrate, N+ impurity areas 112 formed in the P-type well 111, an isolation area 113 formed to surround the N+ impurity areas 112, a P+ impurity area 114 formed to surround the isolation area 113, and contacts 115 formed in each of the N+ impurity areas 112 and the P+ impurity area 114 in a single row or a plurality of rows.

In the case that the diode is used as the first electrostatic discharge section 110 of FIG. 1, the N+ impurity areas 112 can be connected to the input pad through the contacts 115, and the P+ impurity area 114 can be connected to the ground voltage supply line (Vss) through the contacts 115.

Figure 2A:
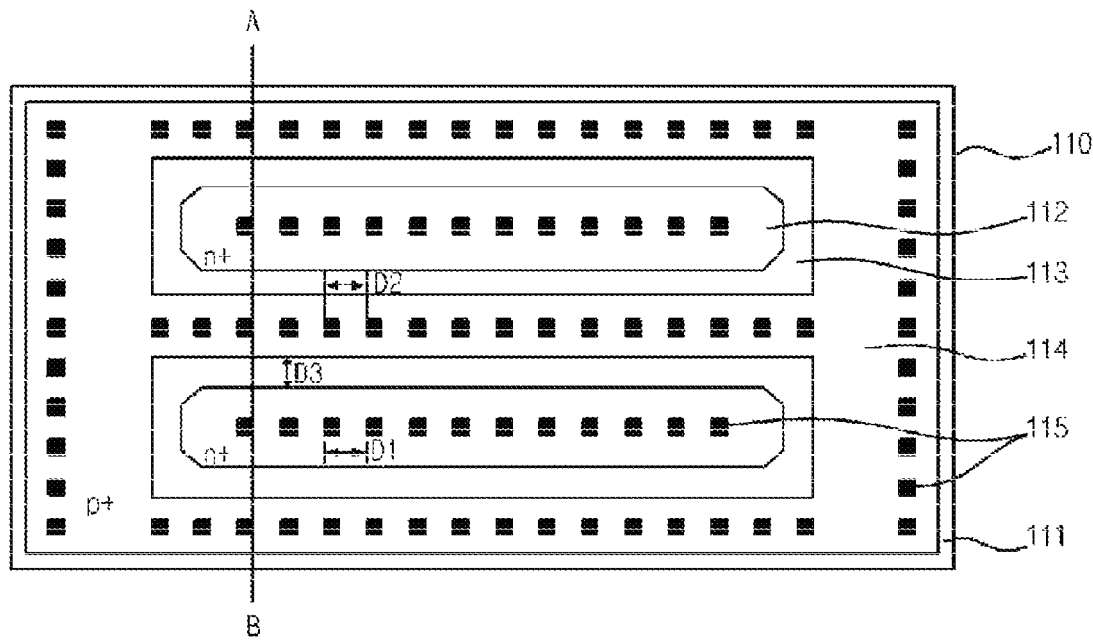
FIG. 2a is a layout diagram of a diode that is used as an electrostatic discharge section of the input/output circuit in FIG. 1.
Figure 2B:
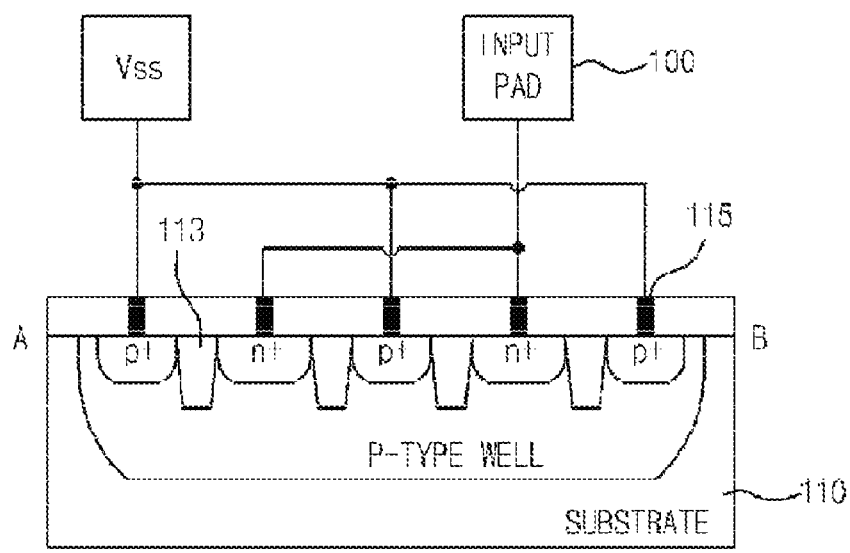

As mentioned above, in a conventional diode, as can be readily seen from FIG. 2, problems are caused in that the pitches of the contacts 115, which are formed in the N+ impurity areas and the P+ impurity area, and the distance between the N+ impurity area and the P+ impurity area are set according to the minimum design rule, and thus, the resulting pin resistance may not be able to satisfy the requirements of the associated specification.

In the embodiments described herein, however, the pitches of the contacts formed in the N+ impurity areas and the P+ impurity area can be increased so that pin resistance can be increased.

Referring again to FIG. 6, the pitches D4 and D5 between the contacts 115 formed in the N+ impurity areas 112 and the P+ impurity area 114 and the distance D6 between the impurity areas can, e.g., each be determined to be at least two times greater than the values defined according to the minimum design rule. In this way, the contact pitches D4 and D5 and the distance D6 between the impurity areas can be determined to be at least two times greater than the values defined according to the minimum design rule, and as the case may be, only one or two of D4, D5 and D6 can be applied.

Further, only one N+ impurity area can be formed to be elongate, or two or more N+ impurity areas can be formed in parallel.

Figure 7:
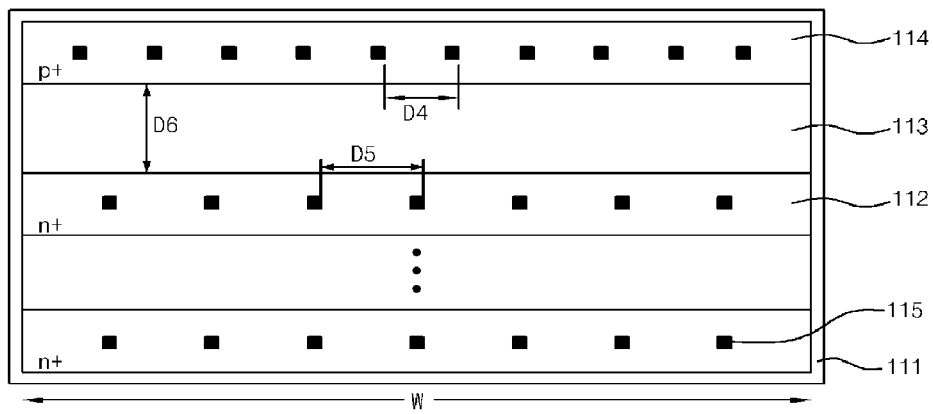
FIG. 7 is a layout diagram of a diode constructed in accordance with still another embodiment.

FIG. 7 is a layout diagram of a diode constructed in accordance with still another embodiment. As can be seen, the diode FIG. 7 can include a P-type well 111 formed in the surface of a P-type semiconductor substrate, one or more N+ impurity areas 112 formed in the surface of the substrate within the P-type well 111 to be elongate or parallel to one another, P+ impurity areas 114 formed to be separated from the N+ impurity areas 112 by a predetermined distance, and isolation areas 113 formed between the N+ impurity areas 112 and the P+ impurity areas 114.

In the structure of FIG. 7, at least one of the contact pitches D4 and D5 of the cathodes and the anodes and the distance D6 between the cathode and the anode can be determined to be at least two times greater than the value defined according to the minimum design rule so that the resistance of the diode can be increased. Further, The cathodes 112 can be connected to the input/output pad of a semiconductor integrated circuit, and the anodes 114 can be connected to the ground voltage supply line (Vss), so that the pin resistance of a semiconductor device can be increased.

A diode, having the structure as shown in FIG. 7 and in which the polarities of impurity areas are changed, can also be envisaged. Such a diode can include one or more P+ anode areas formed in an N-type well formed in the surface of a P-type semiconductor substrate to be elongate or parallel to one another, N+ cathode areas formed to be separated from the P+ anode areas by a predetermined distance, and isolation areas formed between the P+ anode areas and the N+ cathode areas. In the structure of this diode, at least one of the contact pitches of the anodes and the cathodes and the distance between the anode and the cathode can be determined, e.g., to be at least two times greater than the value defined according to the minimum design rule so that the resistance of the diode can be increased.

As is apparent from the above description, implementation of the methods described herein can allow the pin resistance to be significantly increased while minimally increasing capacitance. As a consequence, the pin resistance of a semiconductor product can be easily increased, and therefore, it is possible to satisfy the pin resistance regulated in any given specification.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A diode comprising:
a P-type well formed in a semiconductor substrate;
a first N-type impurity doping area formed in the P-type well;
a second N-type impurity doping area formed in the P-type well;
a first isolation area formed to surround the first N-type impurity doping area;
a second isolation area formed to surround the second N-type impurity doping area;
a first P-type impurity doping area formed to surround the first isolation area;
a second P-type impurity doping area formed to surround the second isolation area;
first contacts formed in the first N-type impurity doping area and the first P-type impurity doping area in a single row or a plurality of rows; and
second contacts formed in the second N-type impurity doping area and the second P-type impurity doping area in a single row or a plurality of rows,
wherein a distance between the second N-type impurity doping area and the second P-type impurity doping area is greater than a distance between the first N-type impurity doping area and the first P-type impurity doping area, and a contact pitch between the second contacts is greater than a contact pitch between the first contacts.

2. The diode according to claim 1, wherein the distance between the first N-type impurity doping area and the first P-type impurity doping area is determined based on a distance that is defined according to a design rule for a minimum distance between an N-type impurity doping area and a P-type impurity doping area in the diode, and the distance between the second N-type impurity doping area and the second P-type impurity doping area is determined to be at least two times greater than the distance between the first N-type impurity doping area and the first P-type impurity doping area.

3. The diode according to claim 1, wherein the contact pitch between the first contacts is based on a contact pitch that is defined according to a minimum contact pitch design rule in the diode, and the contact pitch between the second contacts is determined to be at least two times greater than the contact pitch between the first contacts.

4. The diode according to claim 1, wherein the contact pitch between the first contacts is determined based on a contact pitch that is defined according to a minimum contact pitch design rule in the diode, and the contact pitch between some of the second contacts is determined to be the same as the contact pitch between the first contacts while the contact pitch between the others of the second contacts is determined to be at least two times greater than the contact pitch between the first contacts.

5. The diode according to claim 1, wherein the first N-type impurity doping area is formed to be parallel to the second N-type impurity doping area.

6. A diode comprising:
a well of a first polarity type formed in a semiconductor substrate;
a first impurity doping area of a second polarity type formed in the well;
a second impurity doping area of the second polarity type formed in the well;
a first isolation area formed to surround the first impurity doping area of the second polarity type;
a second isolation area formed to surround the second impurity doping area of the second polarity type;
a third impurity doping area of the first polarity type formed to surround the first isolation area;
a fourth impurity doping area of the first polarity type formed to surround the second isolation area;
first contacts formed in the first impurity doping area and the third impurity doping area in a single row or a plurality of rows; and
second contacts formed in the second impurity doping area and the fourth impurity doping area in a single row or a plurality of rows,
wherein a distance between the second impurity doping area and the fourth impurity doping area is greater than a distance between the first impurity doping area and the third impurity doping area, and a contact pitch between the second contacts is greater than a contact pitch between the first contacts.

7. The diode according to claim 6, wherein the distance between the first impurity doping area and the third impurity doping area is determined based on a distance that is defined according to a design rule for a minimum distance between an impurity doping area of the second polarity type and an impurity doping area of the first polarity type in the diode, and the distance between the second impurity doping area and the fourth impurity doping area is determined to be at least two times greater than the distance between the first impurity doping area and the third impurity doping area.

8. The diode according to claim 6, wherein the contact pitch between the first contacts is determined based on a contact pitch that is defined according to a minimum contact pitch design rule in the diode, and the contact pitch between the second contacts is determined to be at least two times greater than the contact pitch between the first contacts.

9. The diode according to claim 6, wherein the contact pitch between the first contacts is determined based on a contact pitch that is defined according to a minimum contact pitch design rule in the diode, and the contact pitch between some of the second contacts is determined to be the same as the contact pitch between the first contacts while the contact pitch between the others of the second contacts is determined to be at least two times greater than the contact pitch between the first contacts.

10. The diode according to claim 6, wherein the first impurity doping area is formed to be parallel to the second impurity doping area.

* * * * *